United States Patent
Xu et al.

(10) Patent No.: US 10,438,817 B2
(45) Date of Patent: Oct. 8, 2019

(54) CLEANING APPARATUS AND SUBSTRATE PROCESSING APPARATUS

(71) Applicant: Ebara Corporation, Tokyo (JP)

(72) Inventors: Haiyang Xu, Tokyo (JP); Mitsuru Miyazaki, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 15/403,719

(22) Filed: Jan. 11, 2017

(65) Prior Publication Data

US 2017/0207106 A1 Jul. 20, 2017

(30) Foreign Application Priority Data

Jan. 15, 2016 (JP) .................... 2016-006213

(51) Int. Cl.
*H01L 21/67* (2006.01)
*B08B 1/04* (2006.01)
*B08B 3/04* (2006.01)

(52) U.S. Cl.
CPC .... *H01L 21/67023* (2013.01); *H01L 21/6719* (2013.01); *H01L 21/67046* (2013.01); *H01L 21/67196* (2013.01); *B08B 1/04* (2013.01); *B08B 3/041* (2013.01); *H01L 21/67051* (2013.01)

(58) Field of Classification Search
CPC .................... H01L 21/67196; H01L 21/67023
USPC ....................................................... 134/902
See application file for complete search history.

(56) References Cited

U.S. PATENT DOCUMENTS

| | | | | |
|---|---|---|---|---|
| 5,655,954 A | * | 8/1997 | Oishi ................. | B08B 1/04 134/62 |
| 5,671,544 A | * | 9/1997 | Yokomizo ......... | F26B 21/145 34/169 |
| 6,444,472 B1 | * | 9/2002 | Cohen ................ | G01N 35/04 206/443 |
| 6,799,588 B1 | * | 10/2004 | Speh ................. | H01L 21/67051 134/104.2 |

(Continued)

FOREIGN PATENT DOCUMENTS

| | | |
|---|---|---|
| JP | 09-262767 A | 10/1997 |
| JP | 10-163162 A | 6/1998 |
| JP | 2013-38249 A | 2/2013 |

OTHER PUBLICATIONS

An Office Action dated Jun. 11, 2019, issued from the Japan Patent Office (JPO) of Japanese Patent Application No. 2016-006213 and a Machine translation thereof.

*Primary Examiner* — Joseph L. Perrin
*Assistant Examiner* — Kevin G Lee
(74) *Attorney, Agent, or Firm* — Abelman, Frayne & Schwab

(57) ABSTRACT

A cleaning apparatus includes: a cleaning chamber configured to clean a substrate; a transfer chamber positioned adjacent to the cleaning chamber and configured to transfer the substrate; a partition wall partitioning the cleaning chamber and the transfer chamber; a gutter fixed to the partition wall; and a discharge pipe connected to a bottom portion of the gutter. A first pass hole and a second pass hole positioned below the first pass hole are formed in the partition wall. The gutter is positioned between the first pass hole and the second pass hole, and extends from one side end to the other side end of the partition wall.

8 Claims, 10 Drawing Sheets

(56) References Cited

U.S. PATENT DOCUMENTS

| | | | |
|---|---|---|---|
| 2003/0183250 A1* | 10/2003 | Rodney Chiu | B08B 3/02 |
| | | | 134/30 |
| 2006/0278164 A1* | 12/2006 | Petrach | C23C 14/568 |
| | | | 118/719 |
| 2011/0236845 A1* | 9/2011 | Aoki | H01L 21/67109 |
| | | | 432/51 |
| 2015/0314418 A1* | 11/2015 | Shinozaki | B24B 55/06 |
| | | | 156/345.12 |

* cited by examiner

CLEANING APPARATUS AND SUBSTRATE PROCESSING APPARATUS

CROSS-REFERENCE TO RELATED APPLICATIONS

This application is based on and claims priority from Japanese Patent Application No. 2016-006213, filed on Jan. 15, 2016, with the Japan Patent Office, the disclosure of which is incorporated herein in its entirety by reference.

TECHNICAL FIELD

The present disclosure relates to a cleaning apparatus that cleans a substrate such as, for example, a wafer. In addition, the present disclosure relates to a substrate processing apparatus provided with such a cleaning apparatus.

BACKGROUND

A substrate processing apparatus including a polishing apparatus and a cleaning apparatus has been known. The polishing apparatus refers to an apparatus that polishes a surface of a substrate such as, for example, a wafer by causing the substrate and a polishing pad to be in slide contact with each other while supplying a polishing liquid (slurry) to the polishing pad. The polishing liquid or polishing waste including abrasive grains remain on the polished substrate. The cleaning apparatus refers to an apparatus that cleans a polished substrate and removes the polishing liquid or polishing waste remaining on the substrate.

FIG. 9 is a view illustrating a cleaning apparatus that cleans a substrate. As illustrated in FIG. 9, the cleaning apparatus is partitioned into a first cleaning chamber 110, a first transfer chamber 111, a second cleaning chamber 112, a second transfer chamber 113, and a dry chamber 114. Within the first cleaning chamber 110, an upper primary cleaning module 100A and a lower primary cleaning module 100B are disposed to be arranged along a vertical direction. Within the second cleaning chamber 112, an upper secondary cleaning module 101A and a lower secondary cleaning module 101B are disposed to be arranged along a vertical direction. A transfer robot 103 is disposed within the first transfer chamber 111, and a transfer robot 104 is disposed within the second transfer chamber 113. Within the dry chamber 114, an upper dry module 102A and a lower dry module 102B are disposed to be arranged along a vertical direction.

The first cleaning chamber 110 and the first transfer chamber 111 are partitioned by a partition wall 105, the first transfer chamber 111 and the second cleaning chamber 112 are partitioned by a partition wall 106, the second cleaning chamber 112 and the second transfer chamber 113 are partitioned by a partition wall 107, and the second transfer chamber 113 and the dry chamber 114 are partitioned by a partition wall 108. The substrate is primarily cleaned in the first cleaning chamber 110, and secondarily cleaned in the second cleaning chamber 112.

FIG. 10 is a sectional view taken along line A-A of FIG. 9. As illustrated in FIG. 10, substrate pass holes 120, 121 are formed in the partition wall 105 to allow a substrate W to pass therethrough, and the transfer robot 103 takes out a substrate W from the first cleaning chamber 110 through the substrate pass holes 120, 121. The transfer robot 103 changes its direction in a state of holding the substrate W, and transfers the substrate W into the second cleaning chamber 112.

A cleaning liquid is attached to the substrate W cleaned in the first cleaning chamber 110. When the transfer robot 103 changes its direction in the state of holding the substrate W, the cleaning liquid attached to the substrate W may be scattered by a centrifugal force to be attached to the partition wall 105. Thus, as illustrated in FIG. 10, an inclined guide 115 is attached to the partition wall 105 to guide the cleaning liquid attached to the partition wall 105 to the outside of the substrate pass hole 121. The cleaning liquid attached to the partition wall 105 moves obliquely on the inclined guide 115. See, for example, Japanese Patent Laid-Open Publication No. 09-262767.

SUMMARY

An aspect of the present disclosure provides a cleaning apparatus including: a cleaning chamber configured to clean a substrate; a transfer chamber positioned adjacent to the cleaning chamber, and configured to transfer the substrate; a partition wall partitioning the cleaning chamber and the transfer chamber; a gutter fixed to the partition wall; and a discharge pipe connected to a bottom portion of the gutter. A first pass hole and a second pass hole positioned below the first pass hole are formed in the partition wall, and the gutter is positioned between the first pass hole and the second pass hole, and extends from a first side end to a second side end of the partition wall.

The foregoing summary is illustrative only and is not intended to be in any way limiting. In addition to the illustrative aspects, embodiments, and the features described above, further aspects, embodiments, and features will become apparent by reference to the drawings and the following detailed description.

DETAILED DESCRIPTION

In the following detailed description, reference will be made to the accompanying drawings, which form a part hereof. The exemplary embodiments described in the detailed description, drawings, and claims are not meant to be limiting. Other embodiments may be utilized, and other changes may be made without departing from the spirit or scope of the subject matter presented herein.

Figure 10:
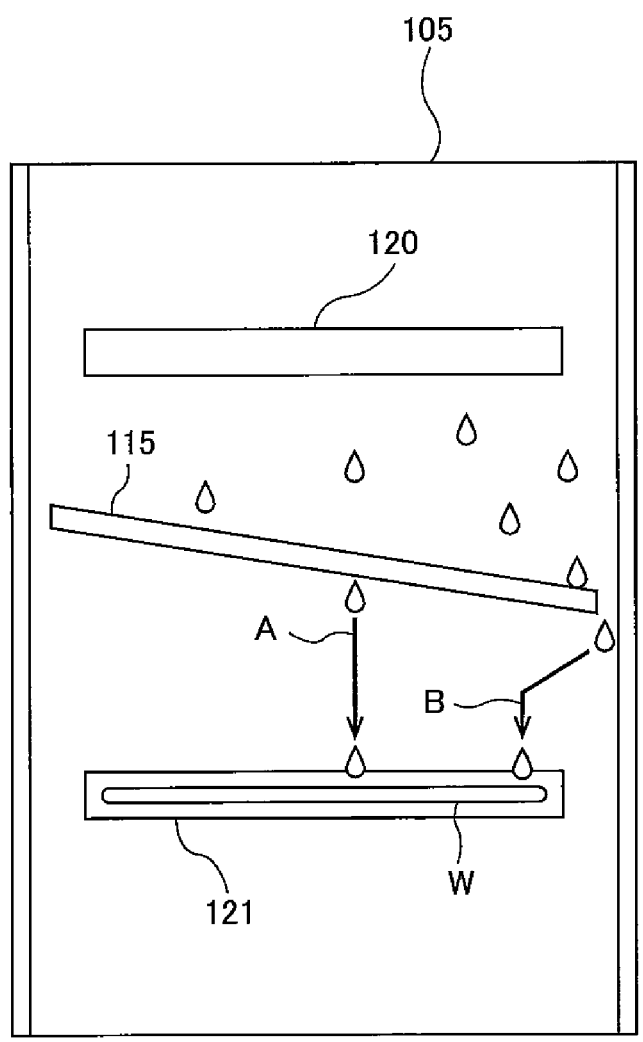
FIG. 10 is a sectional view taken along line A-A of FIG. 9.

The cleaning liquid may overflow from the inclined guide 115 to flow down along the partition wall 105 as indicated by arrow A of, for example, FIG. 10. The cleaning liquid may fall onto the substrate W that is passing through the substrate pass hole 121. In addition, as indicated by arrow B, the cleaning liquid guided to the inclined guide 115 may flow obliquely along the partition wall 105 and fall onto the substrate W that is passing through the substrate pass hole 121. When the cleaning liquid, which has flown down along the partition wall 105, is attached to the substrate W, the substrate W may be contaminated.

The present disclosure has been made in order to solve the above-described problems in the related art, and provides a cleaning apparatus that is capable of capturing the cleaning liquid attached to a partition wall to suppress the contamination of a substrate. In addition, the present disclosure provides a substrate processing apparatus that is provided with such a cleaning apparatus.

An aspect of the present disclosure provides a cleaning apparatus including: a cleaning chamber configured to clean a substrate; a transfer chamber positioned adjacent to the cleaning chamber, and configured to transfer the substrate; a partition wall partitioning the cleaning chamber and the transfer chamber; a gutter fixed to the partition wall; and a discharge pipe connected to a bottom portion of the gutter. A first pass hole and a second pass hole positioned below the first pass hole are formed in the partition wall, and the gutter is positioned between the first pass hole and the second pass hole, and extends from one side end of the partition wall to another side end of the partition wall.

In an exemplary embodiment of the present disclosure, the bottom portion of the gutter is inclined with respect to a horizontal direction, and the discharge pipe is connected to the bottom portion of the gutter at the lowest position, and extends to a location below the second pass hole.

In another exemplary embodiment of the present disclosure, the gutter includes a bank wall that extends upwardly from the bottom portion of the gutter, the bank wall is curved toward the partition wall, the partition wall has an opening that is opened at a position where the bank wall and the partition wall are the closest to each other, and the opening is closed by a closure member and positioned between the closure member and the gutter.

In another aspect of the present disclosure, there is provided a substrate processing apparatus including a polishing apparatus configured to polish a substrate and the above-described cleaning apparatus configured to clean the polished substrate.

According to the present disclosure, the cleaning liquid attached to the partition wall is collected to the inside of the gutter at a position above the second pass hole, and sent to the outside of the cleaning apparatus through the discharge pipe. Accordingly, no cleaning liquid is attached to a substrate that is passing through the second pass hole, and as a result, it is possible to suppress the substrate from being contaminated.

Hereinafter, an exemplary embodiment of the present disclosure will be described with reference to the accompanying drawings.

Figure 1:
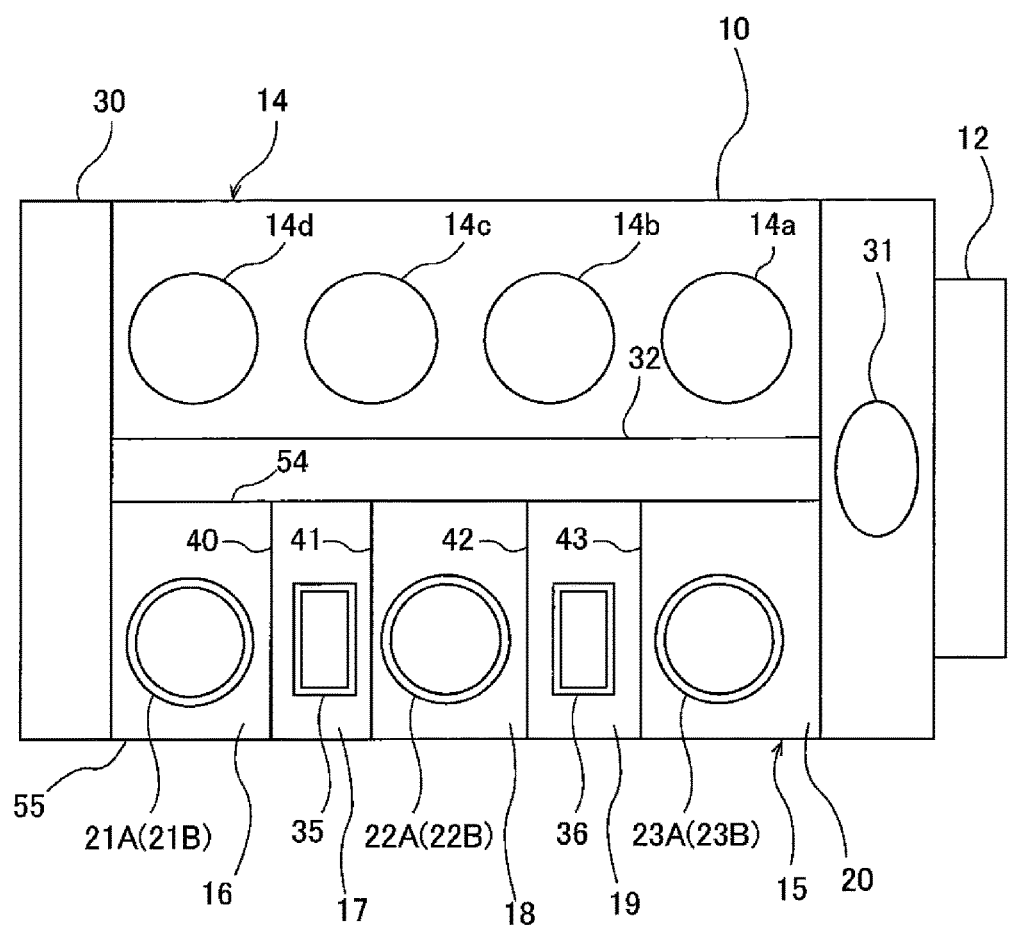
FIG. 1 is a plan view illustrating an overall configuration of a substrate processing apparatus.

FIG. 1 is a plan view illustrating an overall configuration of a substrate processing apparatus. As illustrated in FIG. 1, a substrate processing apparatus includes a substantially rectangular housing 10 and a load port 12 in which a substrate cassette configured to accommodate a plurality of substrates such as wafers is disposed. The load port 12 is disposed adjacent to the housing 10. Within the housing 10, a polishing unit (polishing apparatus) 14, a cleaning unit (cleaning apparatus) 15, and a control unit (controller) 30 configured to control the operations of the polishing unit 14 and the cleaning unit 15 are disposed. The polishing unit 14 includes a plurality of (four (4) in the present exemplary embodiment) polishing units 14a to 14d.

Figure 2:
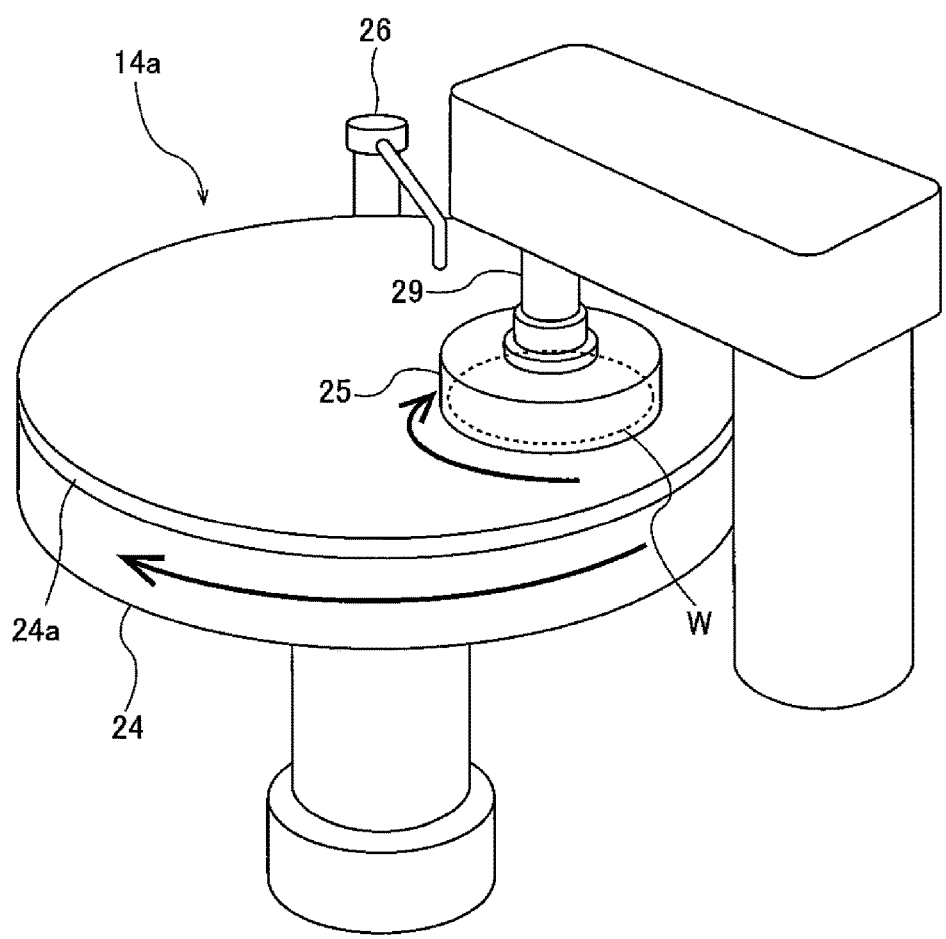
FIG. 2 is a perspective view illustrating a polishing unit.

As the polishing units 14a to 14d have the same configuration with each other, descriptions will be made only for the polishing unit 14a below. FIG. 2 is a perspective view illustrating the polishing unit 14a. The polishing unit 14a includes: a polishing table 24 to which a polishing pad 24a having a polishing surface is attached; a top ring 25 configured to hold a substrate W and presses the substrate W against the polishing pad 24a on the polishing table 24 so as to polish the substrate W; and a polishing liquid supply nozzle 26 configured to supply a polishing liquid or a dressing liquid (e.g., pure water) to the polishing pad 24a.

The top ring 25 is supported on a top ring shaft 29. The polishing pad 24a is bonded to the top surface of the polishing table 24, and the top surface of the polishing pad 24a forms a polishing surface that polishes the substrate W. As indicated by arrows, the top ring 25 and the polishing table 24 are configured to rotate around the central axes thereof, respectively. The substrate W is held on the bottom surface of the top ring 25 by vacuum suction. During the polishing, the top ring 25 and the polishing table 24 are individually rotated, and the polishing liquid is supplied to the polishing surface of the polishing pad 24a from the polishing liquid supply nozzle 26. The substrate W is pressed against the polishing surface by the top ring 25 to be in sliding contact with the polishing surface under the existence of the polishing liquid such that the surface of the substrate W is polished.

Referring back to FIG. 1, the cleaning unit 15 is divided into a first cleaning chamber 16, a first transfer chamber 17 disposed adjacent to the first cleaning chamber 16, a second cleaning chamber 18 disposed adjacent to the first transfer chamber 17, a second transfer chamber 19 disposed adjacent to the second cleaning chamber 18, and a dry chamber 20 disposed adjacent to the second transfer chamber 19. The cleaning chambers 16 and 18 are rooms for cleaning substrates W, and the transfer chambers 17, 19 are rooms for transferring substrates W.

The polishing units 14a to 14d are arranged along the longitudinal direction of the substrate processing apparatus. The first cleaning chamber 16, the first transfer chamber 17, the second cleaning chamber 18, the second transfer chamber 19, and the dry chamber 20 are also serially arranged in the longitudinal direction of the substrate processing apparatus in this order. The first cleaning chamber 16 and the first transfer chamber 17 are partitioned by a partition wall 40, the first transfer chamber 17 and the second cleaning chamber 18 are partitioned by a partition wall 41, the second cleaning chamber 18 and the second transfer chamber 19 are partitioned by a partition wall 42, and the second transfer chamber 19 and the dry chamber 20 are partitioned by the partition wall 43.

In a region surrounded by the load port 12, the polishing unit 14, and the cleaning unit 15, a transfer robot 31 is disposed, and a substrate transfer unit 32 is arranged in parallel with the polishing units 14a to 14d. The transfer robot 31 takes out a substrate W to be polished from the load port 12 and delivers the substrate W to the substrate transfer unit 32, and returns the substrate W after being dried in the dry chamber 20 to the load port 12. The substrate transfer unit 32 transfers a substrate W received from the transfer robot 31 to perform the delivery of the substrate W between the respective polishing units 14a to 14d.

Figure 3:
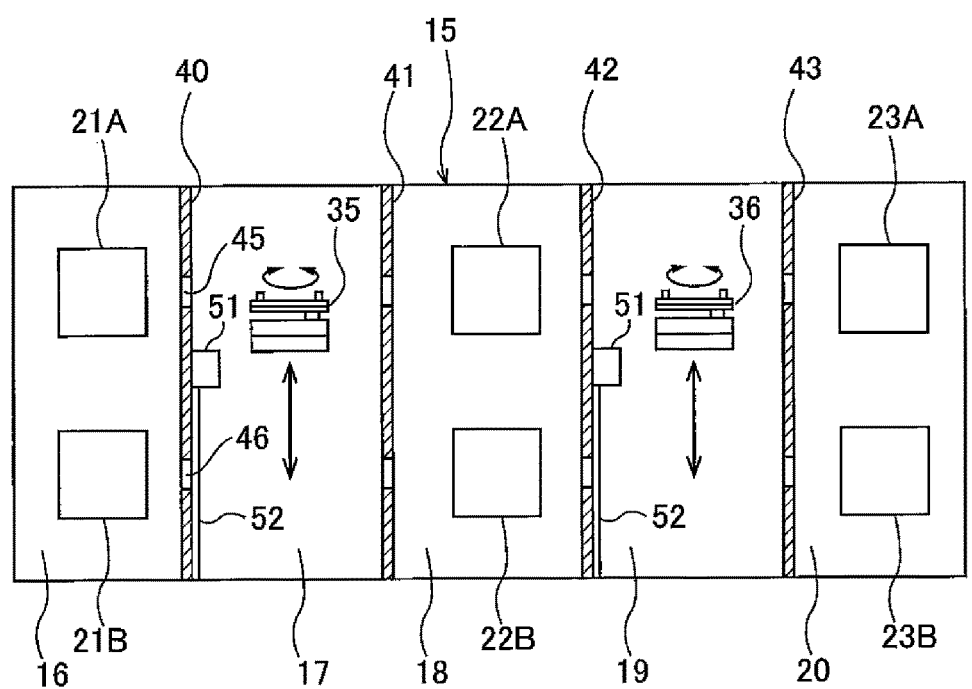
FIG. 3 is a side view illustrating an exemplary embodiment of a cleaning apparatus.

FIG. 3 is a side view illustrating an exemplary embodiment of a cleaning unit (cleaning apparatus) 15. In FIG. 3, the partition walls 40, 41, 42, 43 are illustrated in a cross sectional view. As illustrated in FIG. 3, within the first cleaning chamber 16, an upper primary cleaning module 21A and a lower primary cleaning module 21B are disposed to be arranged along the vertical direction. The upper primary cleaning module 21A is disposed above the lower primary cleaning module 21B. Within the second cleaning chamber 18, an upper secondary cleaning module 22A and a lower secondary cleaning module 22B are disposed to be arranged along a vertical direction. The upper secondary cleaning module 22A is disposed above the lower secondary cleaning module 22B. The primary cleaning modules 21A, 21B and the secondary cleaning modules 22A, 22B are cleaning devices that clean a substrate W using a cleaning liquid.

Figure 4:
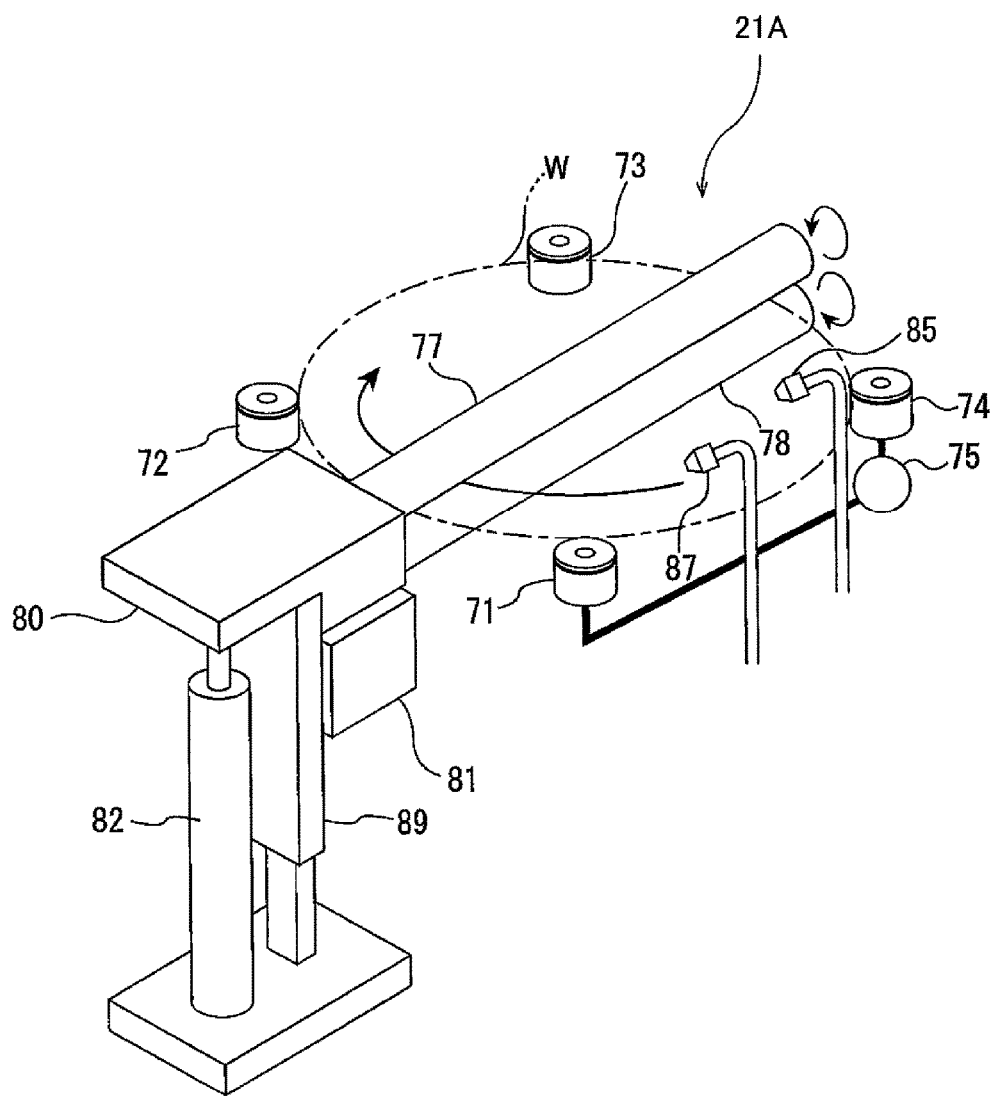
FIG. 4 is a perspective view illustrating an upper primary cleaning module.

Descriptions will be made on the upper primary cleaning module 21A. FIG. 4 is a perspective view illustrating the upper primary cleaning module 21A. In this exemplary embodiment, as a cleaning tool for cleaning a substrate W, a roll sponge is used that extends horizontally. A pen type sponge may also be used as the cleaning tool. The upper primary cleaning module 21A includes: four holding rollers 71, 72, 73, 74 configured to hold and rotate a substrate W; columnar roll sponges 77, 78 that are in contact with the top and bottom surfaces of the substrate W, respectively; cleaning tool rotating devices 80, 81 configured to rotate the roll sponges 77, 78 around the central axes thereof, respectively; an upper cleaning liquid supply nozzle 85 configured to supply a cleaning liquid (e.g., pure water) to the top surface of the substrate W; and an upper chemical liquid supply nozzle 87 configured to supply a chemical liquid to the top surface of the substrate W. Although not illustrated, there are provided a lower cleaning liquid supply nozzle configured to supply a cleaning liquid (e.g., pure water) to the bottom surface of the substrate W and a lower chemical liquid supply nozzle configured to supply a chemical liquid to the bottom surface of the substrate W. An example of the chemical liquid to be used is an etching liquid that has an etching action on a thin film that constitutes the surface of the substrate W.

The holding rollers 71, 72, 73, 74 constitute a substrate holding unit that holds and rotates a substrate W. The holding rollers 71, 72, 73, 74 are movable toward and away from the substrate W by a driving mechanism (e.g., an air cylinder) that is not illustrated. Among the four holding rollers, two holding rollers 71, 74 are connected to a substrate rotating device 75, and are rotated in the same direction by the substrate rotating device 75. When two holding rollers 71, 74 rotate in the state where the four holding rollers 71, 72, 73, 74 hold the substrate W, the substrate W is rotated around the central axis thereof.

The cleaning tool rotating device 80 configured to rotate the upper roll sponge 77 is attached to a guide rail 89 configured to guide the vertical movement of the upper roll sponge 77. In addition, the cleaning tool rotating device 80 is supported by a lift drive mechanism 82, and the cleaning tool rotating device 80 and the upper roll sponge 77 are movable in the vertical direction by the lift drive mechanism 82.

Although not illustrated, the cleaning tool rotating device 81 configured to rotate the lower roll sponge 78 is also supported on the guide rail, and the cleaning tool rotating device 81 and the lower roll sponge 78 are moved in the vertical direction by the lift drive mechanism 82. As for the lift drive mechanism, for example, a motor drive mechanism using a ball screw or an air cylinder may be used. When cleaning the substrate W, the roll sponges 77, 78 are moved toward each other to be in contact with the top and bottom surfaces of the substrate W, respectively.

Referring back to FIG. 3, within the dry chamber 20, an upper dry module 23A and a lower dry module 23B are disposed to be arranged along the vertical direction. The substrate W cleaned in the first cleaning chamber 16 and the second cleaning chamber 18 is dried by any one of the upper dry module 23A and the lower dry module 23B. Each of the upper dry module 23A and the lower dry module 23B may be constituted with a known drier such as, for example, a spin drying device.

A first transfer robot 35 configured to be vertically movable is disposed within the first transfer chamber 17, and a second transfer robot 36 configured to be vertically movable is disposed within the second transfer chamber 19. The first transfer robot 35 operates to transfer a substrate W among the upper primary cleaning module 21A, the lower primary cleaning module 21B, the upper secondary cleaning module 22A, and the lower secondary cleaning module 22B. The second transfer robot 36 operates to transfer a substrate W among the upper secondary cleaning module 22A, the lower secondary cleaning module 22B, the upper dry module 23A, and the lower dry module 23B.

In the cleaning unit 15, a substrate W is cleaned and dried as follows. The substrate W is transferred to the inside of the first cleaning chamber 16 by the first transfer robot 35, and cleaned by any one of the upper primary cleaning module 21A and the lower primary cleaning module 21B. The cleaned substrate W is taken out from the first cleaning chamber 16 by the first transfer robot 35, and transferred to the second cleaning chamber 18. The substrate W is further cleaned by any one of the upper secondary cleaning module 22A and the lower secondary cleaning module 22B. The cleaned substrate W is taken out from the second cleaning chamber 18 by the second transfer robot 36, and transferred to the inside of the dry chamber 20. The substrate W is dried by any one of the upper dry module 23A and the lower dry module 23B. The substrate W cleaned and dried in this way is taken out from the dry chamber 20 by the transfer robot 31 illustrated in FIG. 1, and returned to the substrate cassette on the load port 12.

Figure 5:
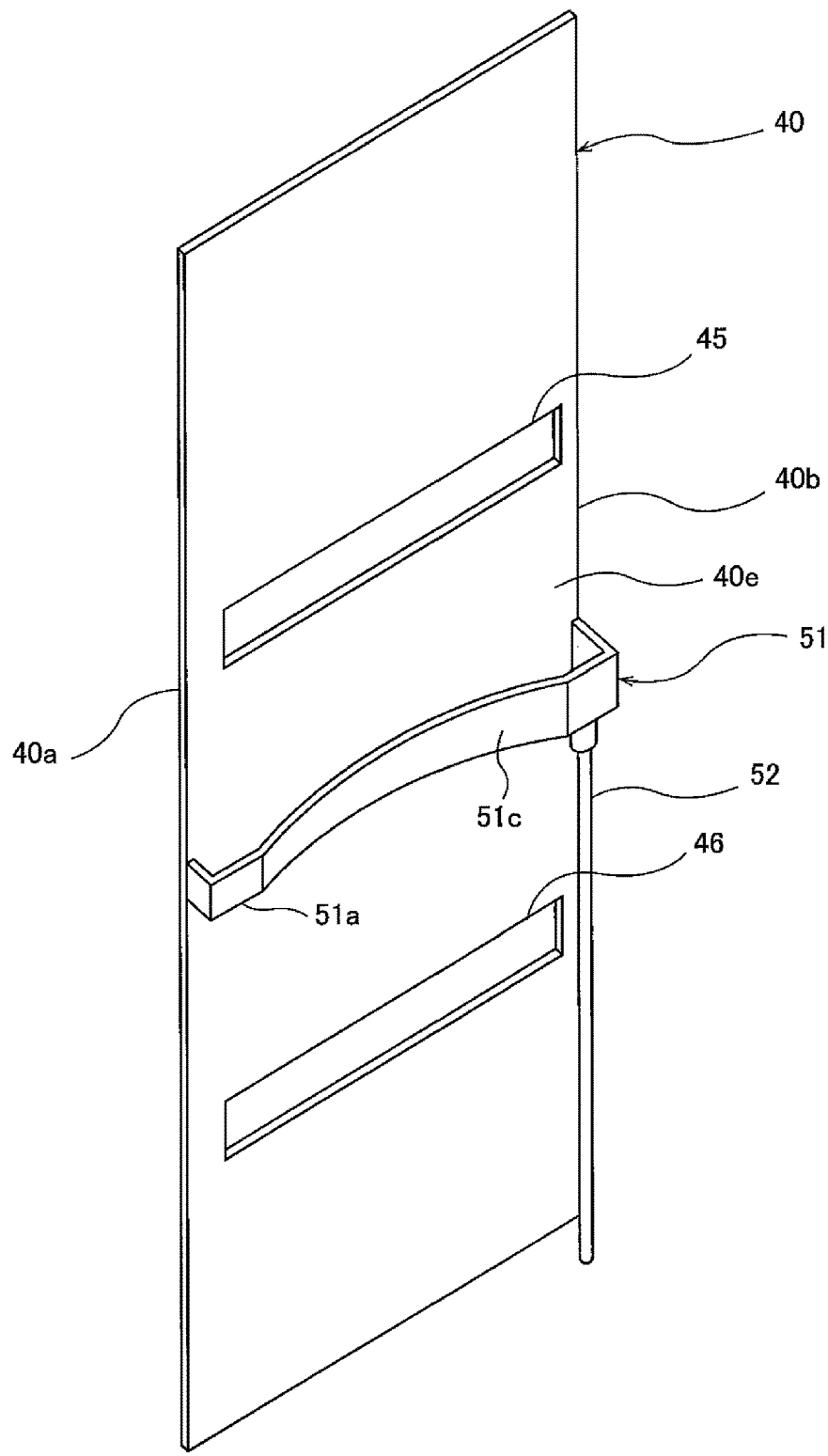
FIG. 5 is a perspective view illustrating a partition wall.
Figure 6:
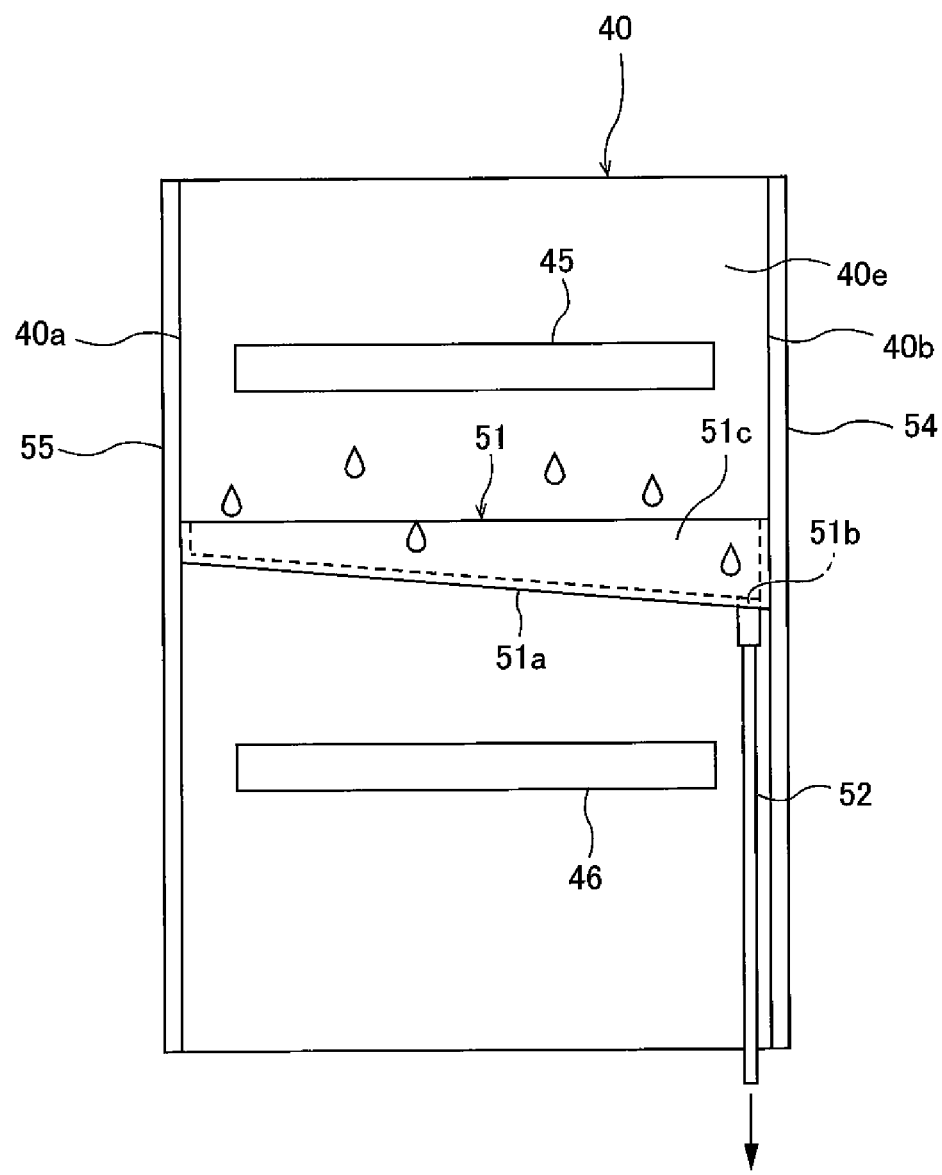
FIG. 6 is a front view of the partition wall.

Next, a configuration for capturing the cleaning liquid attached to the partition wall 40 will be described with reference to the drawings. FIG. 5 is a perspective view illustrating the partition wall 40, and FIG. 6 is a front view of the partition wall 40. The partition wall 40 is formed with: a slit type first pass hole 45 through which a substrate W cleaned by the upper primary cleaning module 21A passes; and a slit type second pass hole 46 through which a substrate W cleaned by the lower primary cleaning module 21B passes. The second pass hole 46 is disposed below the first pass hole 45. The first pass hole 45 and the second pass hole 46 extend in the horizontal direction. The first transfer robot 35 may take out a cleaned substrate W from the first cleaning chamber 16 through the first pass hole 45 and the second pass hole 46.

When the first transfer robot 35 changes its direction within the first transfer chamber 17 in the state of holding the substrate W to which the cleaning liquid is attached, the cleaning liquid may be scattered by a centrifugal force to be attached to the partition wall 40. Thus, a gutter 51 is fixed to the partition wall 40 to be capable of collecting the cleaning liquid flowing down along the partition wall 40. A discharge pipe 52 is connected to the bottom portion 51a of the gutter 51. As illustrated in FIG. 3, a gutter 51 and a discharge pipe 52 are also provided on the partition wall 42. Because the gutters 51 and the discharge pipes 52 provided on the partition walls 40, 42 have the same configurations, respectively, descriptions will be made below only on the gutter 51 and the discharge pipe 52 provided on the partition wall 40.

As illustrated in FIGS. 5 and 6, the gutter 51 is fixed to the front surface 40e of the partition wall 40, and positioned between the first pass hole 45 and the second pass hole 46. The front surface 40e of the partition wall 40 is a surface that defines the first transfer chamber 17. The gutter 51 extends from one side end 40a of the partition wall 40 to the other side end 40b. Accordingly, the cleaning liquid flowing down along the partition wall 40 is received by the gutter 51 and collected within the gutter 51. As illustrated in FIG. 6, the bottom portion 51a of the gutter 51 is inclined by a predetermined angle with respect to the horizontal direction. Accordingly, the cleaning liquid collected in the gutter 51 flows to the lowest position in the gutter 51.

The gutter 51 includes a bank wall 51c extending upwardly from the bottom portion 51a thereof. The bank wall 51c is curved toward the partition wall 40. When the bank wall 51c is curved in this way, the first transfer robot 35 holding the substrate W may be allowed to move in the vertical direction. Accordingly, even if the first transfer robot 35 moves in the vertical direction in the state of holding the substrate W, the substrate W held by the first transfer robot 35 does not come in contact with the gutter 51.

As illustrated in FIG. 6, the discharge pipe 52 is connected to the lowest position in the bottom portion 51a of the gutter 51, and extends to a position below the second pass hole 46. A communication hole 51b is formed in the bottom portion 51a of the gutter 51 at the lowest position. One end of the discharge pipe 52 is connected to the communication hole 51b, and the other end is positioned below the second pass hole 46. For example, the other end of the discharge pipe 52 is connected to an external drain (not illustrated) of the cleaning apparatus 15. According to this configuration, the cleaning liquid received by the gutter 51 flows into the discharge pipe 52 through the communication hole 51b, and flows to the outside of the cleaning apparatus 15 through the discharge pipe 52.

Figure 7:
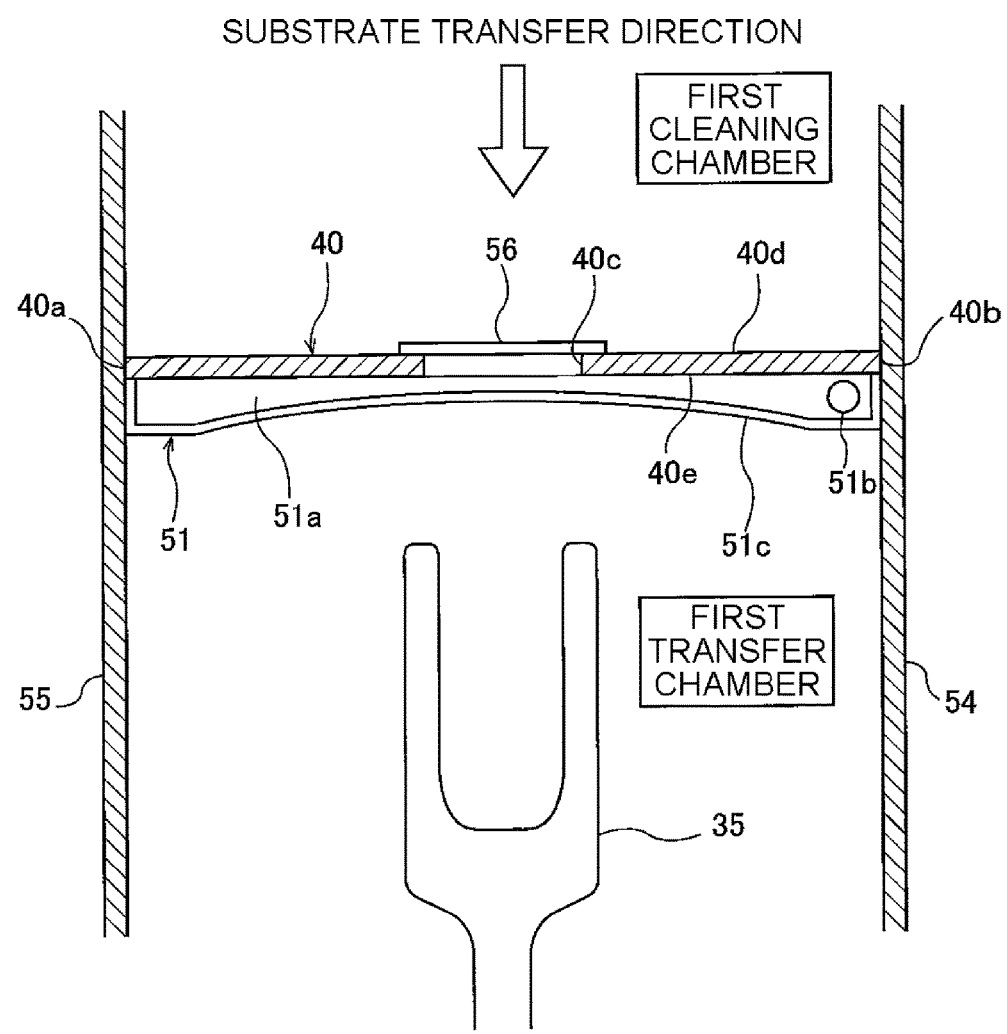
FIG. 7 is a view taken by viewing a gutter from an upper side thereof.

FIG. 7 is a view taken by viewing the gutter 51 from an upper side thereof. As illustrated in FIG. 7, the partition wall 40 is disposed between an outer wall 55 and an inner wall 54 of the substrate processing apparatus. One side end 40a of the partition wall 40 is connected to the outer wall 55, and the other side end 40b is connected to the inner wall 54.

The partition wall 40 has an opening 40c that is opened at a position where the bank wall 51c and the partition wall 40 are closest to each other. The opening 40c of the partition wall 40 is closed by a closure member 56. The closure member 56 is fixed to the rear surface 40d of the partition wall 40 by a fastener such as, for example, a screw (not illustrated). The rear surface 40d of the partition wall 40 is a surface that defines the first cleaning chamber 16. The closure member 56 is larger than the opening 40c, and has a shape that covers the opening 40c. The opening 40c is positioned between the closure member 56 attached to the rear surface 40d of the partition wall 40 and the gutter 51. With this configuration, it is possible to substantially expand the flow path of the cleaning liquid within the gutter 51. Accordingly, the cleaning liquid is capable of flowing within the gutter 51 without overflowing from the bank wall 51c.

According to the present exemplary embodiment, the cleaning liquid attached to the partition wall 40 provided between the first pass hole 45 and the second pass hole 46 is capable of being received by the gutter 51 and discharged through the discharge pipe 52. Accordingly, it may be ensured that the cleaning liquid is prevented from being attached to the substrate W.

Figure 8:
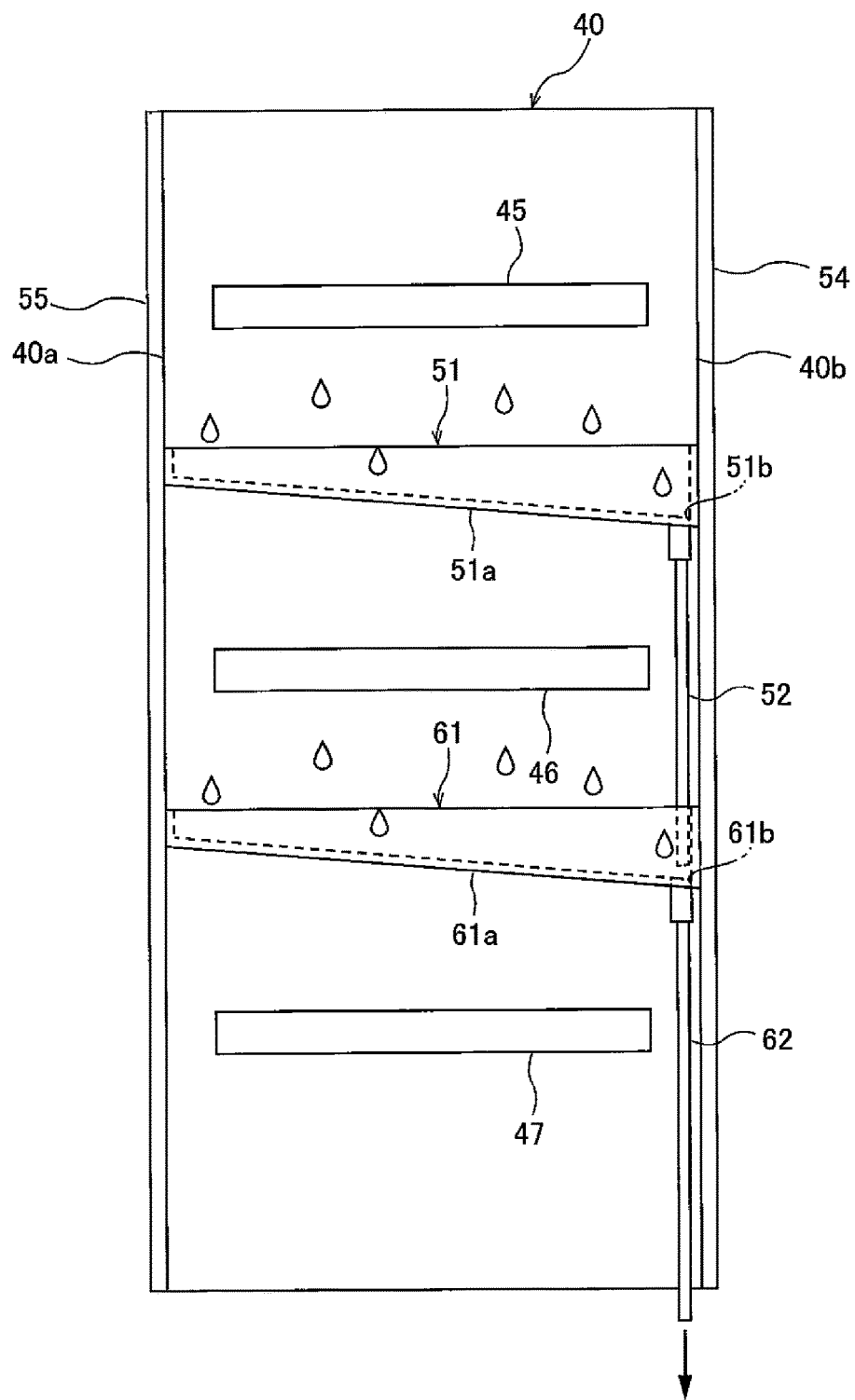
FIG. 8 is a view illustrating another exemplary embodiment of the cleaning apparatus.
Figure 9:
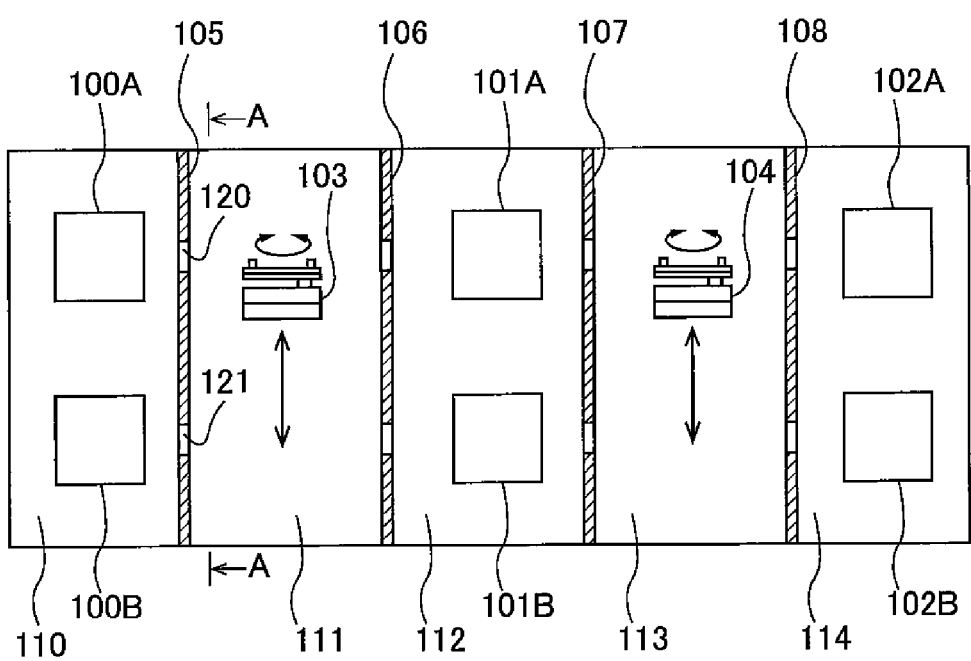
FIG. 9 is a view illustrating a cleaning apparatus that cleans a substrate.

FIG. 8 is a view illustrating another exemplary embodiment of the cleaning apparatus. As illustrated in FIG. 8, the partition wall 40 is formed with a third pass hole 47 in addition to the first pass hole 45 and the second pass hole 46. The third pass hole 47 has the same shape as the first and second pass holes 45, 46, and is disposed below the second pass hole 46.

In the present exemplary embodiment, the cleaning apparatus further includes a gutter 61 fixed to the partition wall 40 and a discharge pipe 62 connected to the bottom portion 61a of the gutter 61. Hereinafter, the gutter 51 will be referred to as a first gutter 51, and the gutter 61 will be referred to as a second gutter 61. Similarly, the discharge pipe 52 will be referred to as a first discharge pipe 52, and the discharge pipe 62 will be referred to as a second discharge pipe 62.

The second gutter 61 is disposed below the first gutter 51, and the second discharge pipe 62 is disposed below the first discharge pipe 52. The second gutter 61 is positioned between the second pass hole 46 and the third pass hole 47, and has the same configuration as the first gutter 51. Accordingly, the detailed descriptions of the second gutter 61 will be omitted.

One end of the second discharge pipe 62 is connected to the bottom portion 61a of the second gutter 61, and the other end is connected to the external drain (not illustrated) of the cleaning apparatus 15. One end of the first discharge pipe 52 is connected to the bottom portion 51a of the first gutter 51, and the other end is positioned within the second gutter 61. More specifically, the other end of the first discharge pipe 52 is positioned above the communication hole 61b formed in the bottom portion 61a of the second gutter 61.

According to the present exemplary embodiment, the cleaning liquid attached to the partition wall 40 provided between the second pass hole 46 and the third pass hole 47 is capable of being received by the second gutter 61 and discharged through the second discharge pipe 62. Accordingly, it may be ensured that the cleaning liquid is prevented from being attached to the substrate W.

From the foregoing, it will be appreciated that various exemplary embodiments of the present disclosure have been described herein for the purpose of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A cleaning apparatus comprising:
   a first chamber configured to clean a substrate;
   a second chamber positioned adjacent to the first chamber, and configured to transfer the substrate;
   a partition wall partitioning the first chamber and the second chamber, and having a first side end and a second side end;
   a first gutter and a second gutter fixed to the partition wall each having a first side end adjacent the first side end of the partition wall and a second side end adjacent the second side end of the partition wall; and
   a discharge pipe connected to a lowest position of the first gutter;
   a first pass hole and a second pass hole positioned below the first pass hole formed in the partition wall; and wherein the first gutter is positioned between the first pass hole and the second pass hole, the second gutter is positioned below the second pass hole, and the first gutter and second gutter each extend from the first side end to the second side end of the partition wall, the first gutter having a bottom portion being inclined with respect to a horizontal direction such that one of the first side end or the second side end of the first gutter forms the lowest position of the first gutter being lower than the other of the first side end or the second side end of the first gutter and the discharge pipe extends to a location below the second pass hole and is located outside an outermost side edge of the second pass hole, and wherein the discharge pipe is positioned within the second gutter.

2. The cleaning apparatus of claim 1, wherein the first gutter includes a bank wall that extends upwardly from the bottom portion of the first gutter, the bank wall is curved toward the partition wall, the partition wall has an opening that is opened at a position where the bank wall and the partition wall are closest to each other, and the opening is closed by a closure member and positioned between the closure member and the first gutter.

3. The cleaning apparatus of claim 1, wherein the substrate that has been cleaned in the first chamber is transferred to the second chamber through one of the first pass hole and the second pass hole while a cleaning liquid is being attached on the substrate.

4. The cleaning apparatus of claim 1, wherein the first gutter is provided at a side of the second chamber.

5. The cleaning apparatus of claim 1, wherein the discharge pipe only has a single exit hole configured to discharge a cleaning liquid received by the first gutter to an outside of the cleaning apparatus.

6. A substrate processing apparatus comprising:
a polishing apparatus configured to polish a substrate; and
the cleaning apparatus claimed in claim 1 and configured to clean the polished substrate.

7. A cleaning apparatus comprising:
a first chamber configured to clean a substrate;
a second chamber positioned adjacent to the first chamber, and configured to receive the substrate;
a partition wall partitioning the first chamber and the second chamber, and having a first side end and a second side end;
a first gutter and a second gutter fixed to an outer surface of the partition wall; and
a first discharge pipe connected to the first gutter and a second discharge pipe connected to the second gutter;
wherein a first pass hole, a second pass hole positioned below the first pass hole, and a third pass hole positioned below the second pass hole are formed in the partition wall, the first gutter is positioned between the first pass hole and the second pass hole, and the second gutter is positioned between the second pass hole and third pass hole, and
wherein the first discharge pipe is positioned within the second gutter.

8. The cleaning apparatus of claim 7 further comprising:
a communication hole formed in a bottom of the second gutter, and
wherein the first discharge pipe is positioned above the communication hole.

* * * * *